United States Patent [19]
Bennett

[11] Patent Number: 6,014,733
[45] Date of Patent: Jan. 11, 2000

[54] METHOD AND SYSTEM FOR CREATING A PERFECT HASH USING AN OFFSET TABLE

[75] Inventor: John R. Bennett, Redmond, Wash.

[73] Assignee: Microsoft Corporation, Redmond, Wash.

[21] Appl. No.: 08/869,913

[22] Filed: Jun. 5, 1997

[51] Int. Cl.[7] .................................................. G06F 12/10
[52] U.S. Cl. .......................... 711/216; 711/220; 711/209; 711/203; 711/202; 711/210; 711/219
[58] Field of Search ..................................... 711/200, 202, 711/210, 216, 220, 221, 203, 128, 6, 205, 206, 207, 208, 209, 211, 219; 364/736.03; 345/202

[56] References Cited

U.S. PATENT DOCUMENTS

| | | | |
|---|---|---|---|
| 4,115,765 | 9/1978 | Hartke ........................................ | 345/202 |
| 4,215,402 | 7/1980 | Mitchell et al. ........................ | 711/216 |
| 4,433,389 | 2/1984 | York et al. .............................. | 711/216 |
| 4,488,256 | 12/1984 | Zolnowsky et al. .................... | 711/210 |
| 5,111,389 | 5/1992 | McAuliffe et al. ..................... | 711/203 |
| 5,133,061 | 7/1992 | Melton et al. .......................... | 711/128 |
| 5,293,593 | 3/1994 | Hodge et al. ........................... | 711/202 |
| 5,377,340 | 12/1994 | Seroussi et al. ........................ | 711/5 |
| 5,584,005 | 12/1996 | Miyaoku et al. ....................... | 711/206 |

OTHER PUBLICATIONS

Sedgewick, Robert, Algorithms in C++, Chapter 16, "Hashing", pp. 231–243, 1992.

*Primary Examiner*—B. James Peikari
*Attorney, Agent, or Firm*—Albert S. Michalik, Esq.

[57] ABSTRACT

A method and mechanism for converting a non-contiguous subset of values in a large range, such as selected Unicode code points, into a contiguous or mostly contiguous smaller range with a perfect hash. The large range is organized into a two-dimensional bitmap matrix of pages and offsets into the pages. The bits in the matrix equal one if the value is in the subset, and zero if not. The pages are then overlaid on one another into a one-dimensional bitmap by shifting each page as necessary to avoid conflicts with values on other pages. The shift amount is recorded and used in a hash computation, wherein a value of the large range is first separated into its page number and its offset into the page. The values are then hashed into the value of the dense subset range by looking up the shift amount for the page and adding the shift amount to the offset into the page.

22 Claims, 11 Drawing Sheets

METHOD AND SYSTEM FOR CREATING A PERFECT HASH USING AN OFFSET TABLE

FIELD OF THE INVENTION

The invention relates generally to computer system storage, and more particularly to an improved method and system for storing data associated with a table.

BACKGROUND OF THE INVENTION

A large table of entries, such as one 64 kilobytes in size and indexed by a 16-bit key, may contain a relatively smaller subset of non-contiguous entries that is supported by a particular application. For example, Unicode is a worldwide character encoding standard based on a 16-bit unit of encoding. With Unicode-configured products supporting only the code points used in a specific language, a smaller, non-contiguous subset of that language's code points are used. By way of example, with Japanese, in which products ordinarily use the Japanese Industrial Standard (JIS) code, only approximately 6,000 symbols, out of the 64 kilobyte possible symbols supported by Unicode, are used. These 6000 or so symbols are widely scattered to various locations throughout the Unicode range, and the remaining code points are of no interest to that product.

Storing a smaller number of character attributes or the like in a full size, 64-kilobyte table leaves many unused entry values. Although this storage method allows a simple indexing operation using the Unicode value as the key, and is thus the fastest method for retrieving stored information, the table is 64k times the size of the attributes, with most of the space wasted. For many systems and applications, the fast retrieval speed is not worth the amount of memory required to implement this method, and thus other storage methods have been attempted.

An alternative to the full size table of entries uses a binary search. While no slots are wasted in such a binary table, the key must be stored with each entry, increasing the amount of space used for storing the entries of interest. Moreover, it takes O(log(N)) operations to perform a look-up, where N is the size of the table, and on the average thus provides relatively slow retrieval compared to other storage methods.

A hash table may be used to store the attributes, indexed by a hash value computed from the code point. One type of hash table is a hash table with collision resolution. This type of hash table must store information to handle collisions, usually accomplished by storing the key with each entry. Extra time is required to test for collisions, and even more time is required to resolve a collision when a collision is detected. Lastly, this type of hash table typically frequently winds up with a number of extra, unused entries, i.e., the table is not always densely packed.

Lastly, perfect hash algorithms (with no collisions) provide desirable performance in many applications, as they can provide a good tradeoff between memory usage and speed. Moreover, with perfect hash algorithms, the keys are not stored with the entries, which saves space. However, extra, unused entries are typically present with perfect hashing, thus wasting space. In addition, the cost (e.g., the amount of processing time) required to calculate the hash value must be given important consideration, since retrieval time is an important factor in each look-up operation. Moreover, what works well for hashing one subset of values of a larger range does not work well for another subset. Consequently, a significant problem with perfect hash algorithms is that in general, no good, rapid and consistent way exists in which to find a perfect hash for a given subset of values that is both very fast and which densely packs the hash values together.

OBJECTS AND SUMMARY OF THE INVENTION

Accordingly, it is a general object of the present invention to provide a method and mechanism for creating a perfect hash on a given subset of noncontiguous values of a larger range.

Yet another object is to provide the method and mechanism as characterized above that densely packs together the hashed values.

Another object is to provide a method and mechanism of the above kind that provides for a very fast computation of the hash value.

A related object is to provide the method and mechanism that operate in an automated manner.

In accomplishing those objects, it is another related object to provide a method and mechanism as characterized above that function well with subsets of non-contiguous Unicode code points.

Yet another object is to provide the above method and mechanism that is fast, reliable, cost-efficient, flexible and extensible to various applications.

Briefly, the present invention provides a method and mechanism for converting a non-contiguous subset of values in a large range into a contiguous or mostly contiguous smaller range with a perfect hash. A subset of values is selected from among the values in the range, and the range is organized into a two-dimensional matrix. One dimension of the matrix represents pages, and the other dimension represents offsets into the pages. At each intersection of a page and offset into the page, the matrix includes mapping information such as a bit indicative of whether the value represented by that intersection is a selected value in the subset, e.g., the bit equals one if selected in the subset or zero if not.

The matrix is then converted into a one-dimensional array (e.g., bitmap) by selecting each page, testing the mapping information (e.g., one-bits) on each page for conflicts with mapping information in the one-dimensional array, and shifting each page an amount until no conflicts are detected. When no conflicts are detected, the page mapping information is overlaid onto the one-dimensional array at the shifted position, and the shift amount is recorded in a page offset table.

When a value of the non-contiguous range is received, the value is separated into a page number and its offset into the page. The value is thereby hashed into the value of the subset range by looking up the shift amount for the page and adding the shift amount to the offset into the page.

Other objects and advantages will become apparent from the following detailed description when taken in conjunction with the drawings, in which:

DETAILED DESCRIPTION OF THE PREFERRED EMBODIMENT

Figure 1:
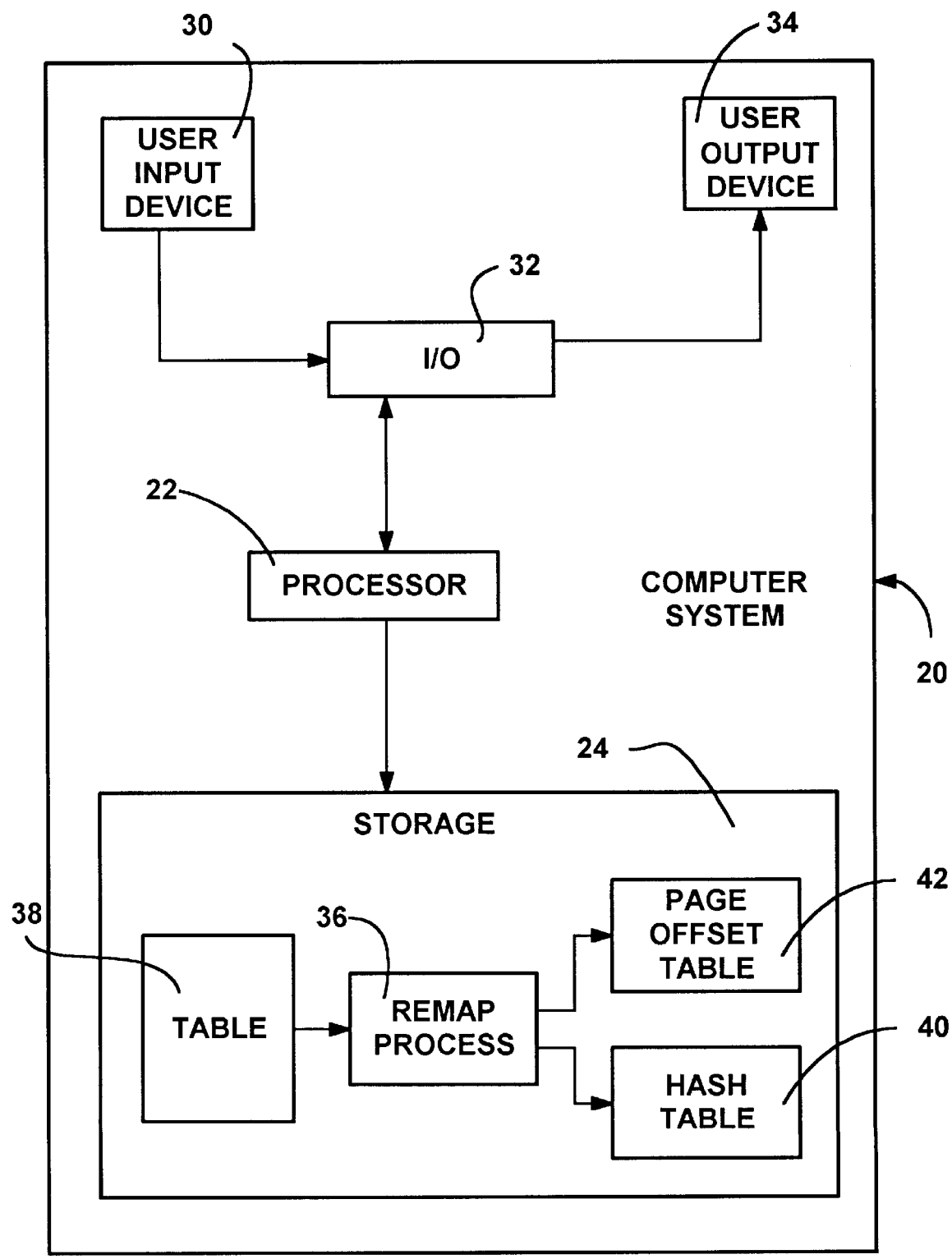
FIG. 1 is a block diagram representing a computer system for creating a perfect hash in accordance with present invention.

Turning to the drawings and referring first to FIG. 1, there is shown a computer system generally designated 20 for re-mapping non-contiguous values using an offset table in accordance with the present invention. The computer system 20 includes a processor 22 operatively connected to storage 24, the storage including random access memory (RAM) and non-volatile storage such as a hard disk-drive, optical drive or the like. As can be appreciated, the non-volatile storage can be used in conjunction with the RAM to provide a relatively large amount of virtual memory via well-known swapping techniques. As will become apparent, read-only-memory (ROM) or similar non-volatile systems may be used with the present invention. Also, embedded systems can benefit from the present invention.

The computer system 20 also includes at least one input device 30, typically a keyboard and/or a user pointing device such as a mouse, connected through input-output circuitry (I/O) 32 for communicating user commands to the processor 22. Similarly, at least one local output device 34 such as a computer display monitor and speakers are connected to the I/O 32 for communicating information, such as via a graphical user interface, from the processor 22 to the user of the system 20.

In accordance with one aspect of the invention, given a subset of values at noncontiguous locations within a large range of values, a re-map process 36 converts the subset into a contiguous, or mostly contiguous, zero-based range. For example, the large range of values may correspond to indexes ranging from 0000h (hexadecimal) to 0ffffh, for indexing a large table 38 of character attributes, e.g., the indexes are Unicode code points. As can be readily appreciated, a significant amount of space needs to be allocated for the table 38. However, only certain of the entries in the table 38 are of interest to a particular application, e.g., only those code points corresponding to a character that is supported by an application or operating system are of interest to that application or operating system. In a typical application, the re-map process 36 essentially takes the entries which are of interest and re-packs them into a mostly dense hash table 40, in a manner that allows the original table key to be received and converted to a hash value index to the mostly-dense hash table 40. As part of the re-mapping process, a table of offsets 42 is generated which, as described below, is used in conjunction with the original index value to compute the hash value of the mostly-dense hash table 40.

Thus, it should be noted that there are two distinct aspects of the present invention. A first aspect involves the conversion of the subset of non-contiguous values, such as the keys of the large table 38, into the offset table 42. A second aspect of the invention involves the subsequent use of the offset table 42 by an operating system, driver, application program or the like, to hash a key of the large table 38 into a hash value, e.g., a hash value index to the mostly-dense hash table 40. In a typical use, the mostly-dense hash table 40 may be loaded into virtually any type of computer-based device, to provide a table of Unicode character attributes or the like. Upon receipt of a Unicode code point which corresponds to a location in the large Unicode table 38, the hash value to the hash table 40 is computed and the attributes found therefrom.

Turning to an explanation of the operation of the invention, the invention provides substantial benefits with the subset of Japanese characters within the 65536 range of Unicode code points. Nevertheless, the invention is not limited to subsets of Unicode code points, but as will become apparent, has many potential applications whenever dealing with a smaller, non-contiguous subset of a larger range.

Figure 2:
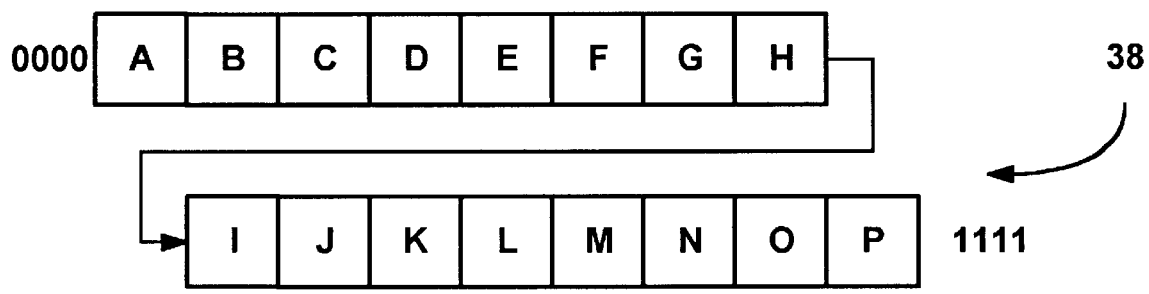
FIG. 2 is a block diagram representing an exemplary table of possible entries.
Figure 3A:
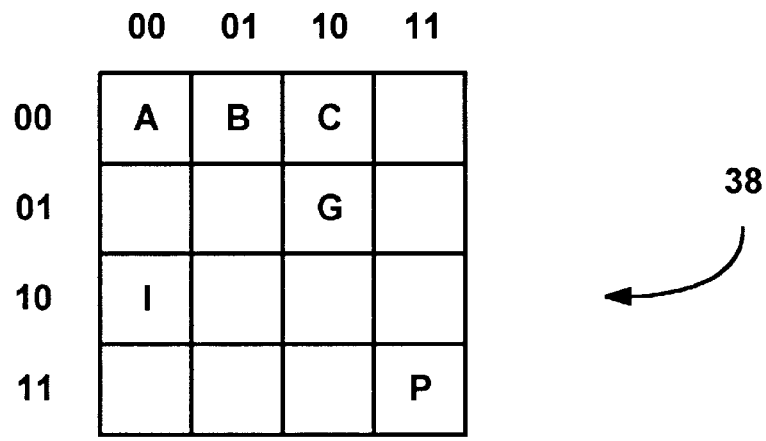
FIGS. 3A and 3B are block diagrams representing alternative ways of viewing selected entries of the table of FIG. 2.
Figure 3B:
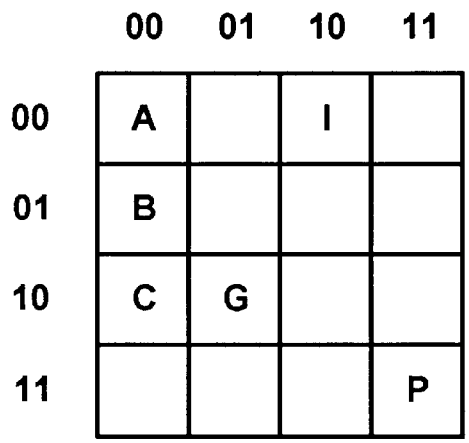

By way of a simplified example, FIG. 2 provides a table 38 of sixteen entries, of which only certain entries are to be remapped into a mostly dense hash table 40. More particularly, the entries indexed by 0000b, 0001b, 0010b, 0110b, 1000b and 1111b are of interest to an application program. For example, as conceptually represented in FIG. 3A, (in a slightly different arrangement), 0000b indexes attributes for graphically displaying the character "A", 0001b indexes the character "B", and so on until 1111b represents a "P". Of these, only A, B, C, G, I and P are to be supported. As can be readily appreciated, this generally corresponds to selecting a non-contiguous set of characters (e.g. Japanese characters) from a 65536 entry table of possible Unicode characters.

Figure 4A:
FIGS. 4A and 4B are block diagrams representing bitmap matrixes for storing information about the selected entries.

To perform the conversion, at steps 800–804 the indexes of the larger table 38 are selected and laid out in a bitmap matrix of rows (pages) and columns. FIG. 4A shows a four row-by-four column matrix 44 for the sixteen entry table. Those indexes of the entries which are of interest, corresponding to the entries in FIG. 3A, have a corresponding bit in the bitmap set equal to one, indicated by an "X" in the bitmap matrix 44 of FIG. 4A (for purposes of visibility and to avoid confusion with the ones and zeroes of the indexes), while all other bits are zero (or blank). For a table indexed by 16-bits such as the 64k Unicode indexes, an initial matrix may, for example, consist of 256 rows (8 bits) and 256 columns (8 bits). Thus, row zero is set with bits equal to one for any desired Unicode characters between 0000h to 00FFh, row one for desired characters in the range 0100 to 01ffh, and so on.

Continuing with the present example, wherein indexes of the table 38 are laid out in the bitmap matrix 44 of FIG. 4A, each row may be considered a page, numbered from 00b to 11b, whereby the column number is an offset into the page from 00b to 11b. Alternatively, the columns may be used as pages, with the row numbers representing the offset into the page. Indeed, when dealing with subsets of the 64 kilobyte set of possible Unicode characters, using the columns as pages and the rows as offsets has been found to provide an even more dense packing in most cases. However, as described below, both ways may be tried, with the best result (most dense packing) being selected.

Figure 4B:
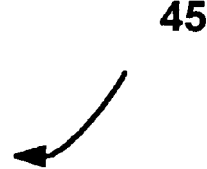

In the present example, as best shown in FIG. 4B, the original four-by-four matrix 44 of FIG. 4A is conceptually restructured into a new matrix 45, such that the columns of FIG. 4A become the pages, (shown horizontally in FIG. 4B), and the rows become the offsets into the page (shown vertically in FIG. 4B).

In accordance with one aspect of the present invention, the pages are overlaid atop one another, one at a time, into a dense or mostly dense resultant one-dimensional bitmap 46. Since the selected indexes (as represented by the one-bits in the bitmap) are non-contiguous and are typically widely scattered, the bits on the several pages tend to interlace with no conflicts, or at least very few conflicts. Whenever a bit representing an index does conflict with another bit, the current page being overlaid onto the resultant bitmap 46 is shifted one character to the right. When the page interlaces perfectly with no conflicts, the shift amount is recorded as an offset for that page in the page offset table 42.

It should be noted that the order in which pages are overlaid one another impacts how well the pages interlace, and thus how much shifting is needed, which ultimately determines the size of the hash table 40. Accordingly, one way in which to find the best packing would be to try all combinations of page ordering, selecting the best result. As can be appreciated, this can become extremely expensive, (e.g., with 16-bit indexes split into 256 rows and 256 columns, 256 factorial combinations are possible).

A less expensive way to obtain a reasonable order for overlaying the pages is to rank the pages such that pages having more one-bits thereon are overlaid into the resultant bitmap 46 before those having less one-bits (i.e., a most to least ranking). To this end, a ranking process is called at step 806 to count the one-bits on the various pages and rank the pages according to the count. Such a one-bit weighted ranking process has been found to provide an extremely dense packing. Indeed, when other optimizations (described below) are combined with this ranking process, packings of one-hundred percent (or very nearly one-hundred percent) are achieved in a rapid manner.

However, notwithstanding the general ranking technique, the first page which starts the hash table is preferably selected to be the first page in the bitmap matrix 45, regardless of the number of characters thereon. Although not necessary to the invention, as will become apparent, selecting zero as a desired index and starting with this page as zero ensures that a zero index in the larger table 38 always maps to zero, which is useful when dealing with null terminated strings and the like.

Figure 5A:
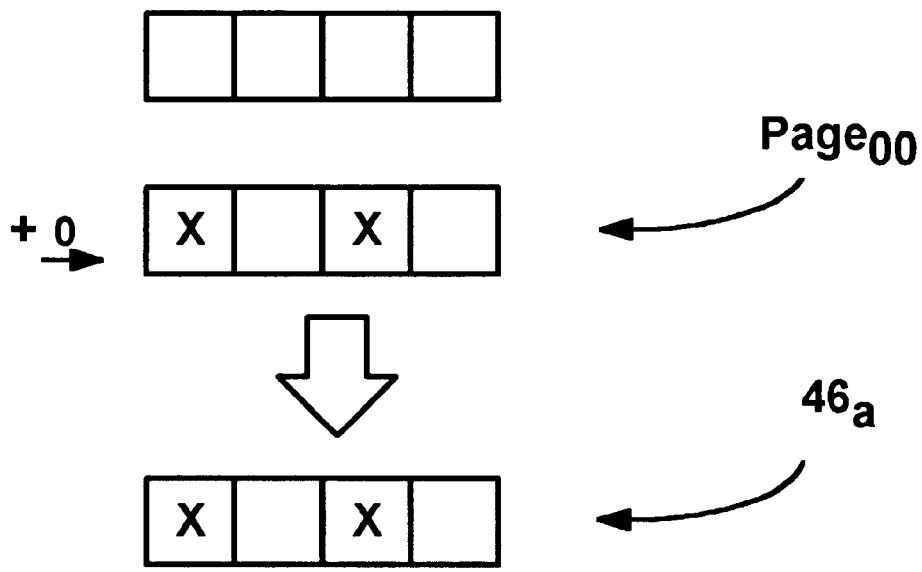
FIGS. 5A, 5B, 5C and 5D comprise block diagrams sequentially illustrating the overlaying of pages from a bitmap matrix into a one-dimensional resultant bitmap in accordance with one aspect of the invention.
Figure 7A:
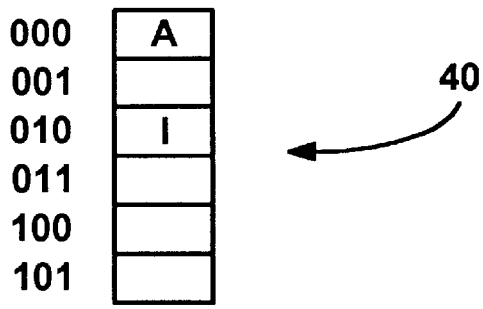
FIGS. 7A, 7B, 7C and 7D are representations of a hash table being filled in with entry information.
Figure 9:
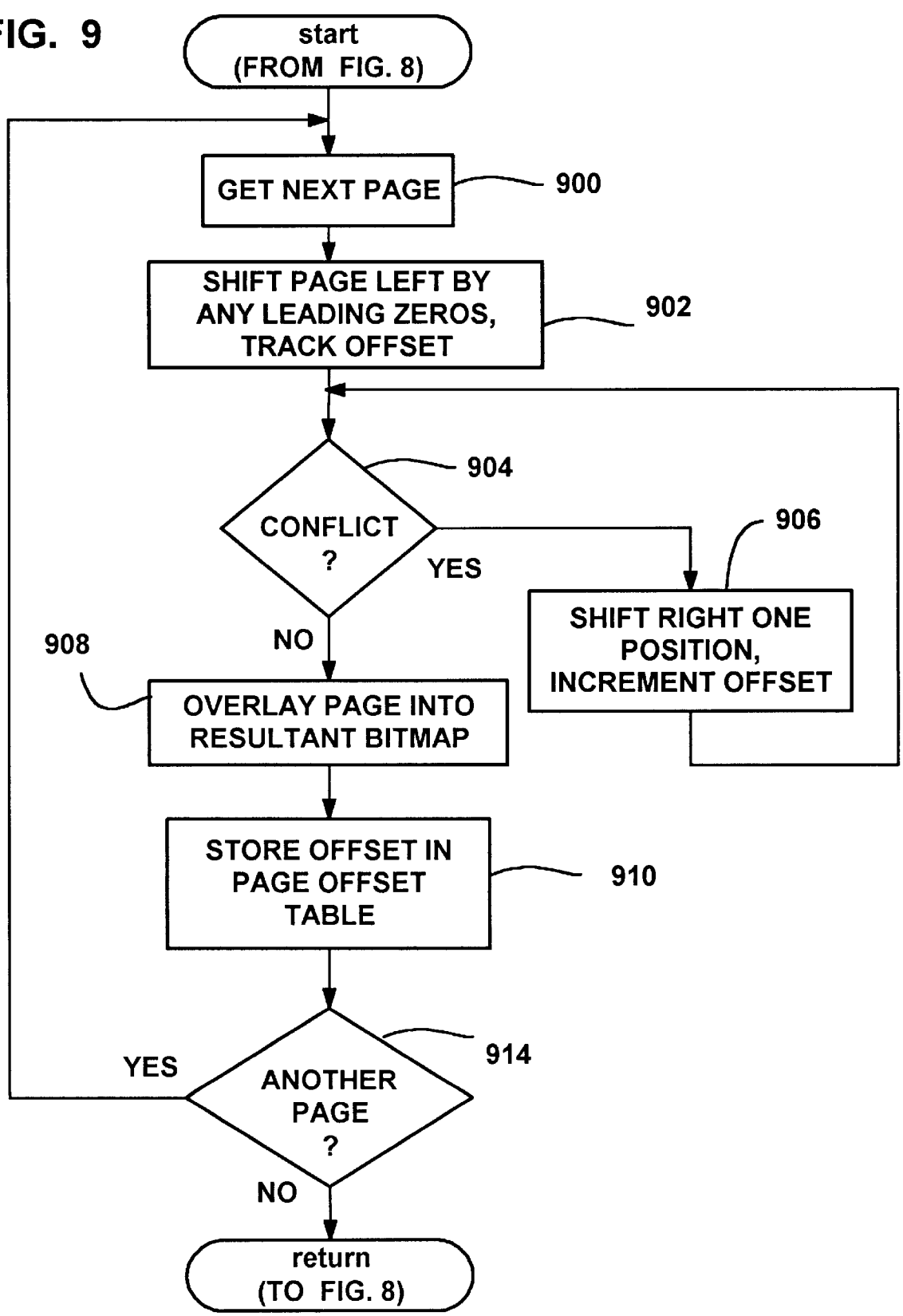
FIG. 9 is a flow diagram generally representing the steps for overlaying pages of the bitmap matrix to create the perfect hash in accordance with the present invention.

FIG. 5A shows the overlay process, corresponding to the flow diagram of FIG. 9, starting with the first page of FIG. 4B at step 900, $page_{00}$, since $page_{00}$ includes the zero index. As shown in FIG. 5A, the resultant one-dimensional bitmap $46_a$ simply becomes this page, and an offset of zero is written in to the page offset table 42 at step 910, since no shifting of this page took place. Note that for the first page, step 900 directly continues to step 908 since there can be no conflicts at this time and, assuming zero is selected, there are no leading zeroes on the first page. Note that when the process is ultimately finished, if this particular bit split is selected, any table data corresponding to each one-bit on the $page_{00}$ will be written to the hash table 40 (such as at a step 814). For example, the "A" attribute data will be written to the position indexed by a zero, and the "I" attribute data to the position indexed by a two, as shown in FIG. 7A. Step 914 tests for another page, and since one is available, returns to step 900 where the next page, $page_{10}$, is selected.

Figure 5B:
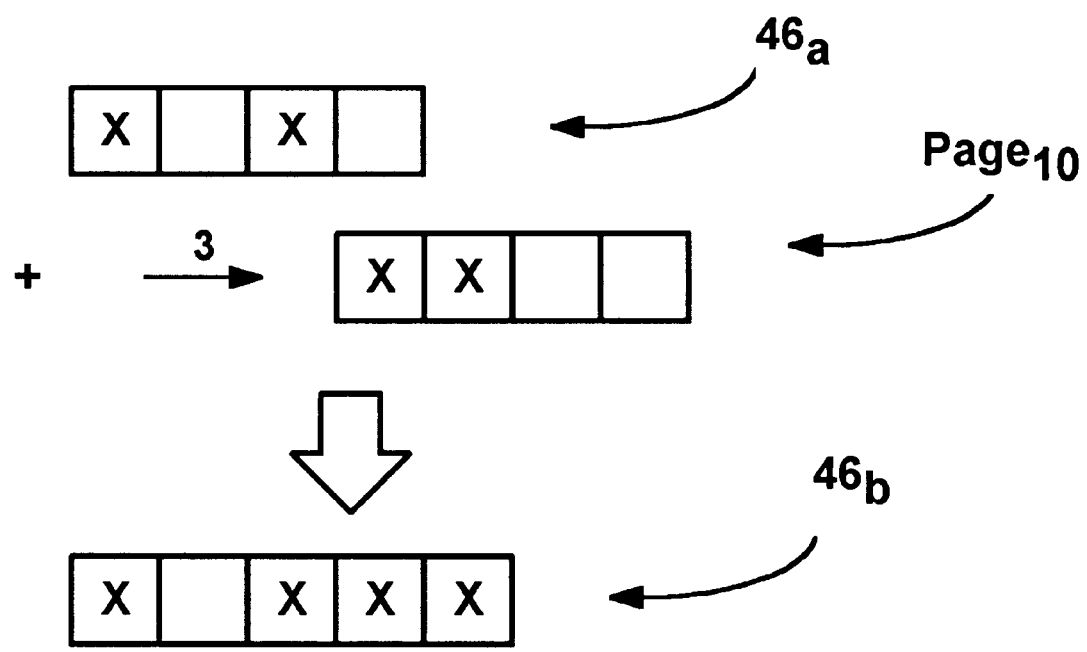

FIG. 5B represents the overlaying of the next page, $page_{10}$, onto the previous resultant bitmap $46_a$, which produces a new resultant bitmap $46_b$. Note that $page_{10}$ is the next to be overlaid because the ranking process of step 806 determined that this row had the most bits set to one thereon (two) compared to the remaining rows.

To overlay the $page_{10}$, at step 902 the $page_{10}$ is first shifted left an amount equal to any leading zero bits. In this position, a test for conflicts is performed at step 904. One such test for conflicts is accomplished by AND-ing the bits of the current page ($page_{10}$) to the previous resultant bitmap $46_a$, and testing for a zero result. If zero, then there are no conflicts. If non-zero, a conflict is detected, whereby at step 906 the page is shifted right one bit and the conflict test repeated. The shifting continues as necessary until no conflicts are detected.

Figure 6A:
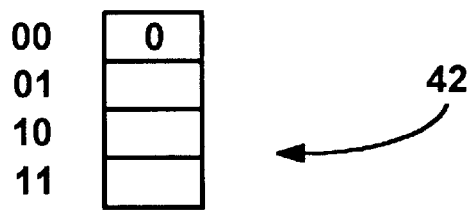
FIGS. 6A, 6B, 6C and 6D represent offset values in a page offset table as the pages of the bitmap matrix are overlaid one another in accordance with one aspect of the invention.
Figure 6B:
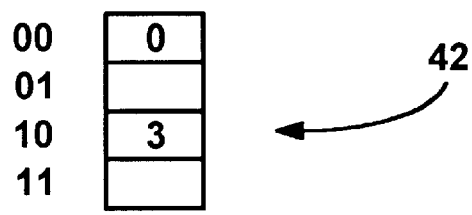
Figure 7B:
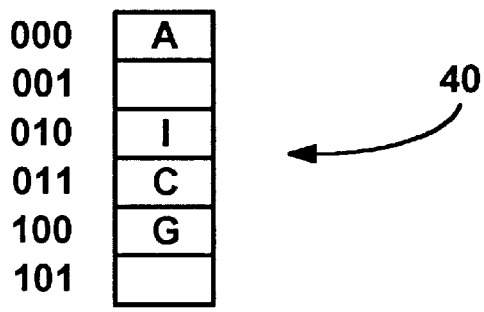

In the present example, the conflict detection and resolution processes of steps 904–906 shifts $page_{10}$ three positions to the right of zero, (as best represented in FIG. 5B), before the page is combined with the previous bitmap $46_a$. The offset of three for this page is recorded in the page offset table 42, as best shown in FIG. 6B. Note that some time later, (such as at step 814), assuming this bit split is selected, the array data, e.g., the "C" and "G" attributes, will be added to hash table 40 at the appropriate locations, as shown in FIG. 7B. Note that as shown in FIG. 5B, the resultant bitmap $46_b$ is now five bits in length, and the hash table 40 will have to have space allocated for at least five entries. Thus, the resultant bitmap 46 grow as necessary to accommodate the shifted bits, as will the hash table 40, however trailing zero bits (blanks) are not considered part of the resultant bitmap 46 since only ones represent (indexes to) entries of interest. Note that the amount that the resultant bitmap 46 grows, which determines the ultimate size of the hash table 40, is dependent on how dense the packing is for the subset of values.

Figure 5C:
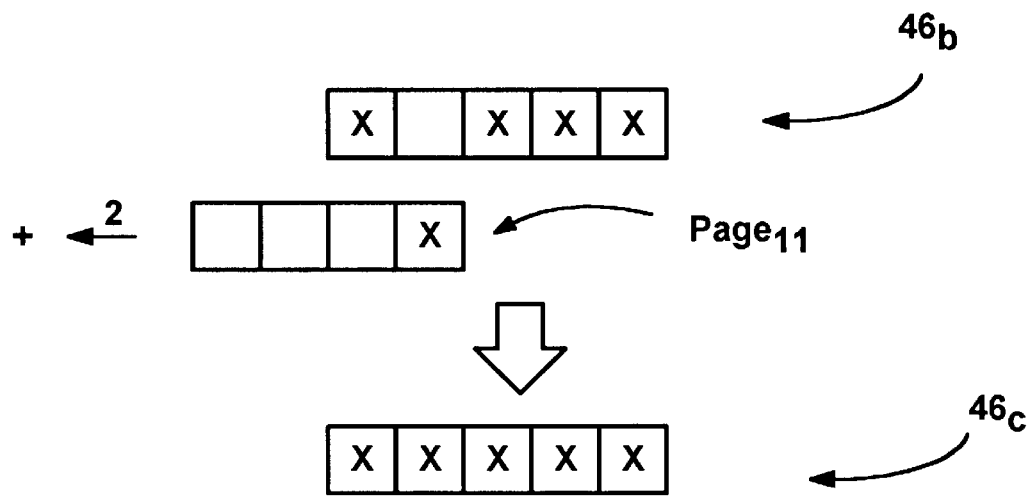
Figure 6C:
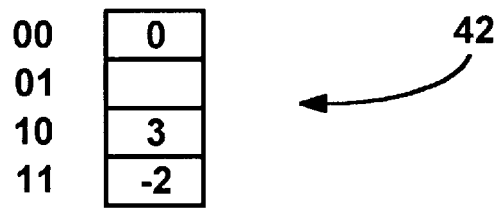
Figure 7C:
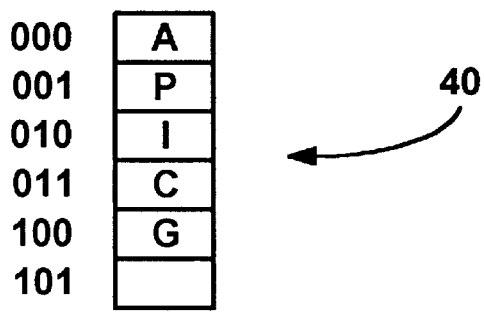

The next page (steps 914 and 900) to be overlaid onto the resultant bitmap 46 is the $page_{11}$. Note that $page_{11}$ and $page_{01}$ each have one bit set therein, but for purposes of this example it is assumed that the ranking process of step 806 has ranked $page_{11}$ for placement before $page_{01}$. As seen in the matrix 45 of FIG. 4B, and in FIG. 5C, $page_{11}$ has three leading zero bits (blanks). Accordingly, before attempting the overlay process, at step 902, the $page_{11}$ is first shifted left three times before testing for conflicts. As is apparent, step 904 determines that a conflict exists at this (negative three) offset, and thus at step 906 the page is shifted right one place (the offset is incremented) and the conflict test repeated. This time step 904 determines that there are no conflicts, and thus at step 908, the $page_{11}$, with an offset of negative two, is combined with the previous resultant bitmap $46_b$ into a new resultant bitmap $46_c$ (FIG. 5C). At step 910, the offset of negative two for this page is recorded in the appropriate location (at location three) in the page offset table 42, as best shown in FIG. 6C. Note that later, such as at step 814, the data corresponding to this index, e.g., the attributes of "P," will be saved in the hash table 40 in the position corresponding to the index location in the resultant bitmap $46_c$ as shown in FIG. 7C.

Figure 5D:
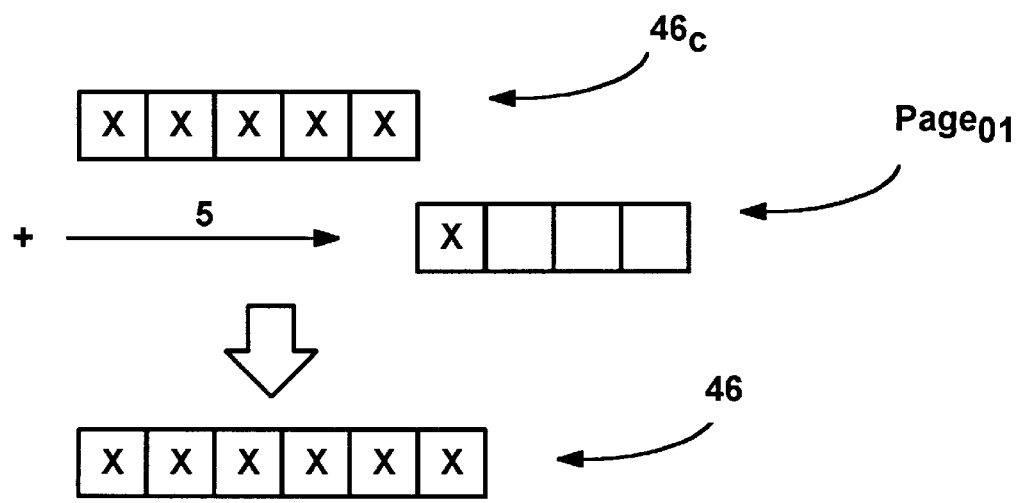

The last remaining page to be overlaid onto the resultant bitmap 46 is the $page_{01}$. As seen in the matrix 45 of FIG. 4B, and in FIG. 5D, $page_{01}$ has no leading zero bits (blanks). Accordingly, the $page_{01}$ is not shifted left by step 902 before testing for conflicts. As is apparent, at step 904, a conflict exists at the zero offset, and thus the page is shifted right one place at step 906, the offset is incremented and the conflict test of step 904 repeated. As can be readily appreciated, conflicts continue to be detected at step 904 and the page shifted by step 906 until the $page_{01}$ is offset by positive five positions. As a result, the page$_{01}$, with an offset of plus five, is combined with the previous resultant bitmap 46$_c$ into a new, and final resultant bitmap 46 (FIG. 5D) Note that the page$_{01}$ was shifted the entire size of the previous resultant bitmap. More particularly, since the previous bitmap 46$_c$ had one-hundred percent packing, page$_{01}$ was overlaid beginning at the end of the previous resultant bitmap. Note that it is feasible to test for one-hundred percent packing, and, if detected, immediately overlay the next page at the end rather than start at the beginning and repeatedly shift to the end.

Figure 6D:
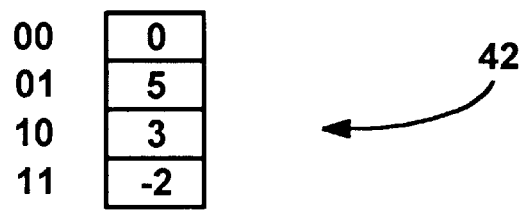
Figure 7D:
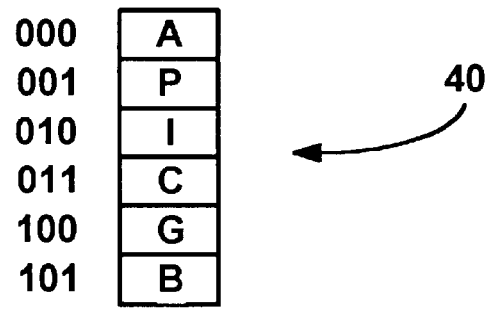
Figure 8:
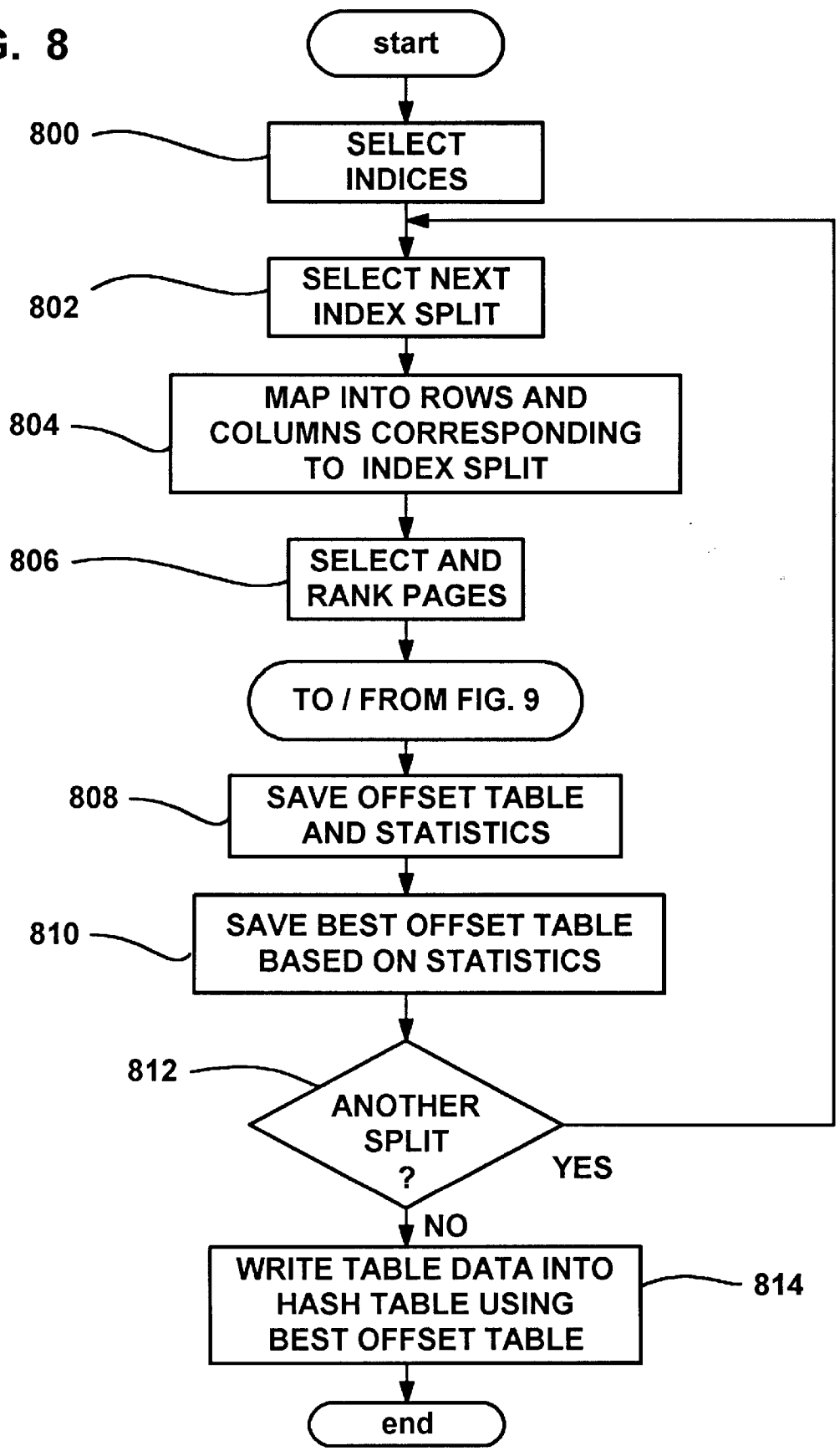
FIG. 8 is a flow diagram generally representing the steps for creating the perfect hash in accordance with the present invention.

At step 910, the offset of five for this page is recorded in the page offset table 42, as best shown in FIG. 6D. The process now returns to FIG. 8. Again, note that at some later step 814, the attribute data corresponding to this index, e.g., the attributes of "B," will be saved in the hash table 40 in the position corresponding to the index location in the resultant bitmap 46, as shown in FIG. 7D.

At this time, the six scattered indexes and corresponding data of the initial sixteen-entry table 38 can be remapped into a densely-packed hash table 40 indexed by values ranging from zero to five, along with the page offset table 42 of four entries (e.g., bytes). Note that even with such a small example, the memory savings may be significant. For example, if the initial sixteen-entry table 38 allocated one (1) kilobyte per index, the table required sixteen (16) kilobytes of memory. However, the same data may be stored in a six (6) kilobyte hash table, plus four storage units (e.g., words or bytes) for the page offset table. Indeed, as will be described below, only the page offset table 42 is needed to convert an key to the initial large table 38 into a hash value index of the dense hash table 40. Larger subsets of even larger arrays provide similar savings, and particularly benefit from the automated re-mapping process.

Although not necessary to the invention, in order to find an optimally dense packing, various bitmap matrixes may be tried, including those which do not have the same number of rows and columns. For example, with sixteen bit indexes, splits other than 8 bits by 8 bits may be used to re-map the values in the above-described manner. To accomplish the finding of the optimal split, at step 808, the size of the resultant hash table 40 and the page offset table 42 are preserved as statistics associated with the hash table 40. Then, the process loops back to step 802 to construct other matrixes, each time varying the way in which the values are split into rows and columns. For example, 16-bit indexes can be divided into 128 pages of 512 columns (7 by 9 bits), 512 pages of 128 columns (9 by 7 bits), 64 pages of 1024 columns (6 by 10 bits) and so on. If a particular loop iteration improves on the formerly best split, the page offset table and accompanying statistics are substituted for the former ones, whereby the split that uses the least amount of space will ultimately remain after all (reasonable) splits have been tried (step 812). Note that the above-described mapping operation is sufficiently fast such that all sensible combinations may be tried until the optimal mapping available via this method is recognized. Moreover, as described above, once split into rows and columns, the pages which are overlapped may be viewed both vertically and horizontally to find the best possible packing. Once the optimal mapping is found, the offset table 42 therefor may be used to write the original table entries into a dense or mostly-dense hash table 40 at step 814.

Figure 10:
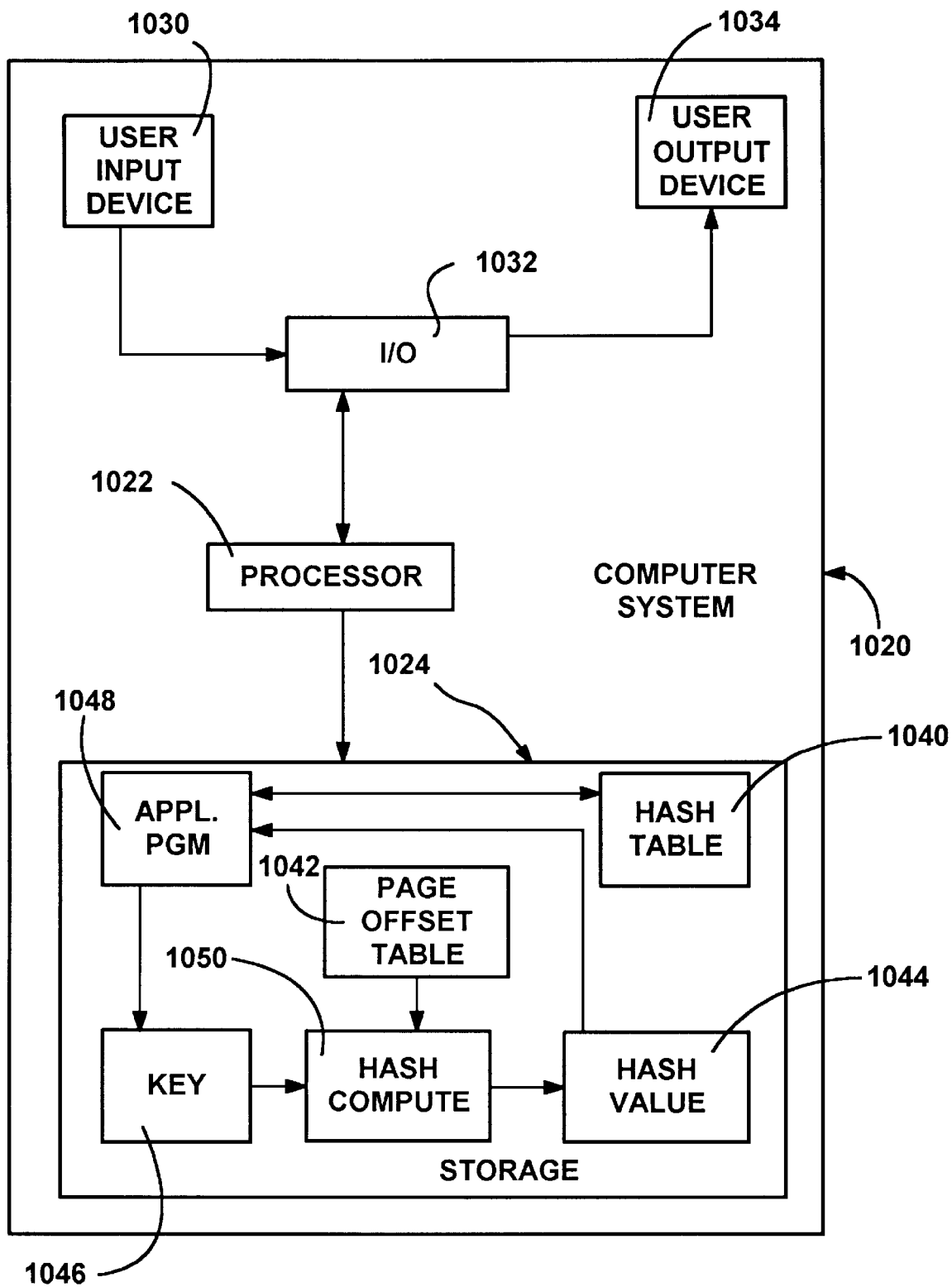
FIG. 10 is a block diagram representing a computer system for computing a hash value from a key in accordance with another aspect of the present invention.

Turning to the usage of the page offset table to compute a hash value index into the hash table, another computer system is shown in FIG. 10. In FIG. 10, like components to those in FIG. 1 have been renumbered one-thousand numbers higher than their counterparts in FIG. 1. In this system 1020, which may be, for example, a relatively low-powered hand-held computing device, the storage 1024 includes the completed hash table 1040 and the page offset table 1042, such as for the purpose of displaying selected characters such as Unicode characters. Accordingly, a second aspect of the invention deals with the conversion of a key of the original, large table 38, to a hash value 1044, which serves as an index to the dense hash table 1040. Note that the tables 1040 and 1042 are typically stored in non-volatile memory, such as burned into a ROM or the like.

Figure 11:
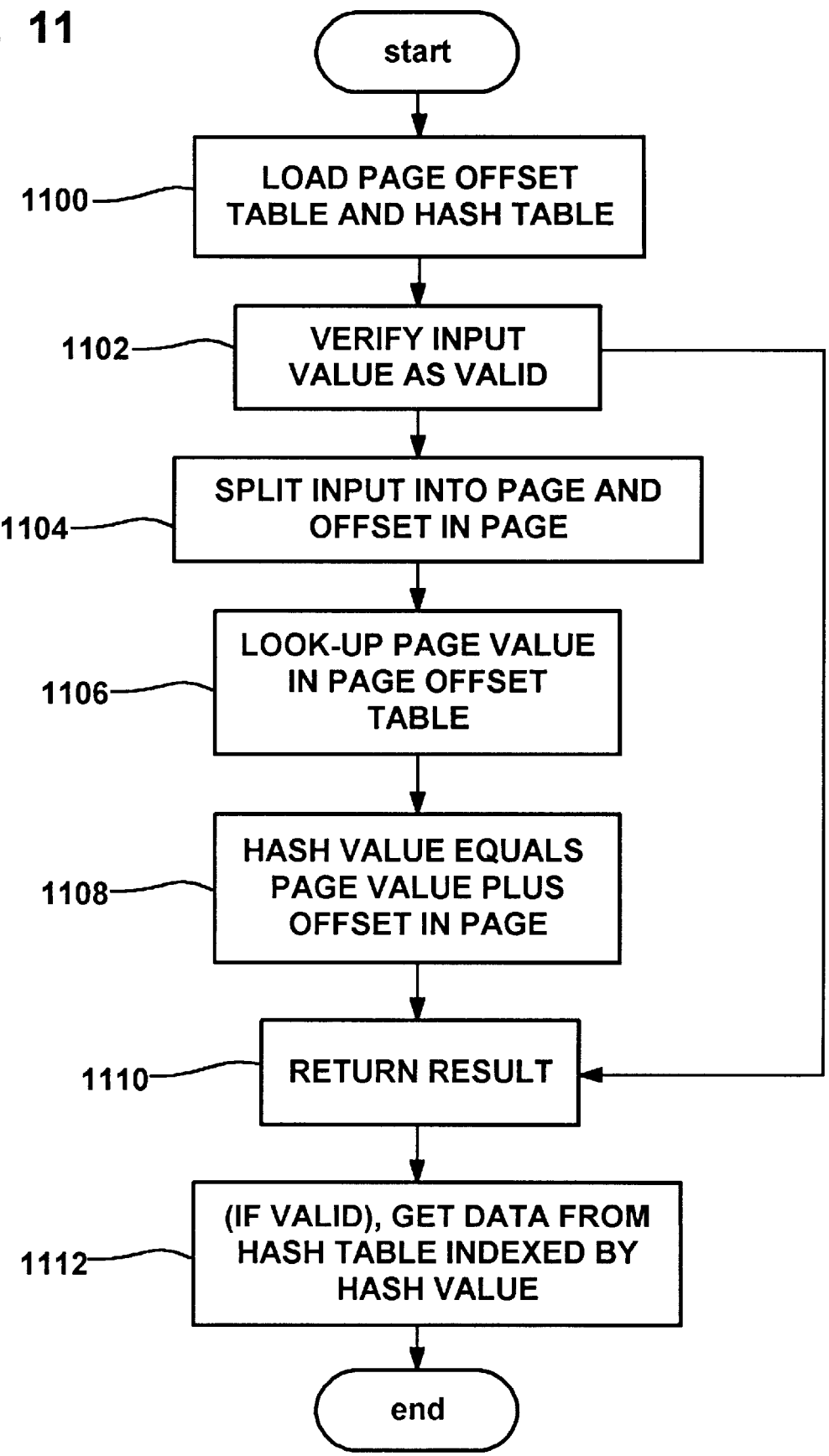
FIG. 11 is a flow diagram generally representing the steps for computing the hash value from a key.

To accomplish the hash computation, an application program 1048 or the like first loads (or if already loaded, locates) the page offset table 1042 and hash table 1040 into the storage 1024 (at step 1100 of FIG. 11). An key 1046 (input value) is received by the application program 1048 or the like and is provided to a hash computation process 1050, whereby at step 1104 (FIG. 11) the value is first split into the same bit groupings that were used to construct the page offset table 1042. The bit split is apparent from the size of the page offset table 1042, i.e., the number of page offset table 1042 entries equals the number of pages and thus indicates the number of bits used to store the page's offset information, e.g., 128 entries corresponds to seven bits. Of course, the split and other information (e.g., a filename of the corresponding hash table) may also be maintained in header information or the like with the page offset table 1042.

In any event, when an input value is received that corresponds to the initial large table 38, (where the vertical columns became the pages), the high portion of the value is masked off by the computation process 1048 as part of step 1104, leaving the appropriate number of valid low bits representing the page number. In the simplified example, the high portion equals two bits of the four possible bits, and thus the upper two bits are masked off. The remaining two bits are used as a zero-based index into the offset table 1042. For example, if a 0110b is received, such as for the purpose of displaying the "G" character, the upper bits are masked off leaving a 10b. Similarly, within step 1104, the upper bits, which represent the offset into the page, are obtained by shifting the non-masked upper bits the same number of bits in the page number to the right.

At step 1106, the page number is used as in index into the page offset table 1042, whereby a look-up operation is performed to determine the offset value for the corresponding page. In the present example, a 10b provides an offset value of three. At step 1108, this value is added to the offset into the page (equal to 01b as determined from the masking and shifting of the upper bits at step 1104). The result (three plus one equals four) is the computed hash value index to the hash table 1040, and is returned to the application program 1048 at step 1110, which then obtains the appropriate data from the hash table 1040. As can be seen, the four (100b) entry in the hash table 40 of FIG. 7D properly indexes the "G" character. The table below sets forth the results of all valid computations, which are otherwise not described in detail herein:

| Input value | Lower bits | Offset value (dec.) | Upper bits | Hash = Sum of Offset + Lower (dec.) | Hash Table Data |
|---|---|---|---|---|---|
| 0000b | 00 | 0 | 00 | 0 | A |
| 0001b | 01 | 5 | 00 | 5 | B |
| 0010b | 10 | 3 | 00 | 3 | C |

-continued

| Input value | Lower bits | Offset value (dec.) | Upper bits | Hash = Sum of Offset + Lower (dec.) | Hash Table Data |
|---|---|---|---|---|---|
| 0110b | 10 | 3 | 01 | 4 | G |
| 1000b | 00 | 0 | 10 | 2 | I |
| 1111b | 11 | −2 | 11 | 1 | P |

As can be appreciated, the computation is extremely fast, consisting only of an AND, (for masking), a shift, indexing an array (the page offset table 1042) and an add.

It should be noted that to provide the correct result, the hash computation requires a valid input value, i.e., one that is supported by the application employing the hash table. A validity check (such as represented by step 1102) may be performed on the value to ensure that it corresponds to a valid input before performing the hash computation. If the input value is valid, the hash is perfect, as any valid key provides a unique result without collisions.

Moreover, other than the hash table data itself, only the offset table need be maintained to compute the hash value. Accordingly, any other information accumulated during the construction of the offset table such as the resultant bitmaps and the statistics may be discarded. Of course, some metadata and/or other information may be maintained with the offset table and/or hash table if desired, e.g., so that an application can load the proper hash table and corresponding offset table if more than one are available in a system.

As can be seen from the foregoing detailed description, there is provided a method and mechanism for creating a perfect hash on a given subset of noncontiguous values of a larger range. The method and mechanism densely packs together the hashed values while providing for a very fast computation of the hash value. The method and mechanism operate in an automated manner and functions particularly well with subsets of non-contiguous Unicode points. The method and mechanism are fast, reliable, cost-efficient, flexible and extensible.

While the invention is susceptible to various modifications and alternative constructions, certain illustrated embodiments thereof are shown in the drawings and have been described above in detail. It should be understood, however, that there is no intention to limit the invention to the specific forms disclosed, but on the contrary, the intention is to cover all modifications, alternative constructions, and equivalents falling within the spirit and scope of the invention.

What is claimed is:

1. In a computer system including a range of values, a method of converting a non-contiguous subset of values in the range into a contiguous or mostly contiguous smaller range with a perfect hash, comprising the steps of:

selecting the subset of values from among the values in the range;

organizing the range into a two-dimensional matrix, one dimension of the matrix representing pages and the other dimension representing offsets into the pages, the matrix at each intersection of a page and offset into the page including mapping information therein indicative of whether the value represented by that intersection is a selected value in the subset; and converting the matrix into a one-dimensional array by selecting each page, testing the mapping information on each page for conflicts with mapping information in the one-dimensional array, shifting each page an amount until no conflicts are detected, overlaying the mapping information in the page onto the one-dimensional array at the shifted position, and recording the shift amount.

2. The method of claim 1 wherein the matrix and one-dimensional array are bitmaps, and wherein the mapping information is stored in a value of the bitmap.

3. The method of claim 1 further comprising the step of ordering the pages into a ranking order, and wherein the step of selecting each page includes the step of selecting each page according to the ranking order.

4. The method of claim 3 wherein the step of ordering the pages includes the steps of counting the number of times that the mapping information indicates that a value on a page is a selected value in the subset, and ranking the pages from a highest count to a lowest count.

5. The method of claim 3 wherein the step of ordering the pages includes the step of selecting a first page in the matrix as a first page in the ranking order.

6. The method of claim 1 wherein the values of the range of values equal binary numbers consisting of a plurality of bits, and wherein the dimensions of the matrix correspond to a split of the bits representing the values.

7. The method of claim 6 further comprising the steps of selecting a plurality of bit splits, repeating the steps of organizing and converting with each of the bit splits, obtaining statistical information corresponding to the contiguous range of subset values for each bit split, and selecting the range of subset values based on a comparison of the statistics therefor with statistics for other subset ranges.

8. The method of claim 1 wherein the range of values corresponds to a table of information, and further comprising the step of writing information from the table into a hash table at a location corresponding to the recorded page shift information and offset into the page for the selected value corresponding thereto.

9. The method of claim 1 further comprising the steps of receiving a value of the non-contiguous range, and hashing the value into a value of the subset range by separating the value into a page number and an offset into the page, looking up the shift amount for the page and adding the shift amount to the offset into the page.

10. The method of claim 1 wherein the range of values ranges from 0 to 65535.

11. The method of claim 10 wherein the values represent possible Unicode code points, and wherein the subset of values represent selected Unicode code points.

12. In a computer system including a range of values, a mechanism for converting a non-contiguous subset of values in the range into a contiguous or mostly contiguous smaller range with a perfect hash, comprising:

means for selecting the subset of values from among the values in the range;

means for organizing the range into a two-dimensional matrix, one dimension of the matrix representing pages and the other dimension representing offsets into the pages, the matrix at each intersection of a page and offset into the page including mapping information therein indicative of whether the value represented by that intersection is a selected value in the subset; and means for converting the matrix into a one-dimensional array by selecting each page, said means including means for testing the mapping information on each page for conflicts with mapping information in the one-dimensional array, means for shifting each page an amount until no conflicts are detected, means for overlaying the mapping information in the page onto the one-dimensional array at the shifted position, and means for recording the shift amount.

13. The mechanism of claim 12 wherein the matrix and one-dimensional array are bitmaps, and wherein the mapping information is stored in a value of the bitmap.

14. The mechanism of claim 12 further comprising means for ordering the pages into a ranking order, and wherein the means for selecting each page includes means for selecting each page according to the ranking order.

15. The mechanism of claim 14 wherein the means for ordering the pages includes means for counting the number of times that the mapping information indicates that a value on a page is a selected value in the subset, and means for ranking the pages from a highest count to a lowest count.

16. The mechanism of claim 14 wherein the means for ordering the pages includes means for selecting a first page in the matrix as a first page in the ranking order.

17. The mechanism of claim 12 wherein the values of the range of values equal binary numbers consisting of a plurality of bits, and wherein the dimensions of the matrix correspond to a split of the bits representing the values.

18. The mechanism of claim 17 further comprising means for selecting a plurality of bit splits, means for repeatedly organizing and converting the range using each of the bit splits, means for obtaining statistical information corresponding to the contiguous range of subset values for each bit split, and means for comparing the statistics of each of the subset ranges for selecting a range of subset values.

19. The mechanism of claim 12 wherein the range of values corresponds to a table of information, and further comprising a hash table, means for writing information from the table into the hash table at a location corresponding to the recorded page shift information and the offset into the page for the selected value corresponding thereto.

20. The mechanism of claim 12 further comprising means for receiving a value of the non-contiguous range, and means for hashing the value into a value of the subset range including means for separating the value into a page number and an offset into the page, means for looking up the shift amount for the page and means for adding the shift amount to the offset into the page.

21. The mechanism of claim 12 wherein the range of values ranges from 0 to 65535.

22. The mechanism of claim 21 wherein the values represent possible Unicode code points, and wherein the subset of values represent selected Unicode code points.

* * * * *